(12) United States Patent
Sugita et al.

(10) Patent No.: US 9,349,584 B2
(45) Date of Patent: May 24, 2016

(54) METHOD FOR DEPOSITING A FILM AND FILM DEPOSITION APPARATUS

(71) Applicant: Tokyo Electron Limited, Tokyo (JP)

(72) Inventors: Kippei Sugita, Yamanashi (JP); Hiroyuki Hashimoto, Yamanashi (JP); Muneo Harada, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 111 days.

(21) Appl. No.: 14/396,116

(22) PCT Filed: Apr. 22, 2013

(86) PCT No.: PCT/JP2013/061810
§ 371 (c)(1),
(2) Date: Oct. 22, 2014

(87) PCT Pub. No.: WO2013/161772
PCT Pub. Date: Oct. 31, 2013

(65) Prior Publication Data
US 2015/0087158 A1    Mar. 26, 2015

(30) Foreign Application Priority Data

Apr. 27, 2012 (JP) .................. 2012-102609
Feb. 5, 2013 (JP) .................. 2013-020057
Feb. 15, 2013 (JP) .................. 2013-027972

(51) Int. Cl.
*H01L 21/02* (2006.01)
*H01L 21/768* (2006.01)
(Continued)

(52) U.S. Cl.
CPC ...... *H01L 21/02118* (2013.01); *C23C 16/4408* (2013.01); *C23C 16/52* (2013.01); *H01L 21/022* (2013.01); *H01L 21/02271* (2013.01); *H01L 21/02337* (2013.01); *H01L 21/02359* (2013.01); *H01L 21/76831* (2013.01);
(Continued)

(58) Field of Classification Search
CPC ............. H01L 21/02118; H01L 21/02271; H01L 21/02337; H01L 21/02359; H01L 21/76831; C23C 16/4481; C23C 16/45512
See application file for complete search history.

(56) References Cited

U.S. PATENT DOCUMENTS 4,180,614 A * 12/1979 Angelo .................. B05D 1/60
427/255.6
4,759,958 A * 7/1988 Numata ................ H01L 21/312
257/E21.259

(Continued)

FOREIGN PATENT DOCUMENTS

JP    2000-077365    3/2000
JP    2001-085419    3/2001
(Continued)

*Primary Examiner* — Fernando L Toledo
*Assistant Examiner* — Christine L Hagan
(74) *Attorney, Agent, or Firm* — IPUSA, PLLC

(57) ABSTRACT

A method for depositing a film is provided. In the method, an object to be processed is accommodated in a process chamber, and an insulating film made of a polymer thin film is deposited on a surface of the object to be processed by supplying a first source gas composed of an acid anhydride and a second source gas composed of a diamine into the process chamber that is evacuated. Next, the insulating film is modified so as to have a barrier function by stopping the supply of the second source gas into the process chamber and continuously supplying the first source gas into the process chamber.

5 Claims, 10 Drawing Sheets

(51) Int. Cl.
*C23C 16/44* (2006.01)
*C23C 16/455* (2006.01)
*C23C 16/52* (2006.01)
*B05D 1/36* (2006.01)
*B05D 1/00* (2006.01)

(52) U.S. Cl.
CPC ........... *H01L 21/76898* (2013.01); *B05D 1/36* (2013.01); *B05D 1/60* (2013.01); *B05D 2490/50* (2013.01); *C23C 16/455* (2013.01)

(56) References Cited

U.S. PATENT DOCUMENTS

| | | | | |
|---|---|---|---|---|
| 5,288,697 | A * | 2/1994 | Schrepp | H01L 39/247 427/255.6 |
| 5,306,666 | A * | 4/1994 | Izumi | H01L 21/76877 257/E21.17 |
| 5,869,219 | A * | 2/1999 | Kuo | B05D 3/0486 257/E21.259 |
| 5,952,448 | A * | 9/1999 | Lee | C08G 73/10 525/432 |
| 6,252,154 | B1 * | 6/2001 | Kamada | H01L 35/32 136/201 |
| 6,663,716 | B2 * | 12/2003 | Loan | C23C 16/44 118/726 |
| 8,470,706 | B2 * | 6/2013 | Arnold | H01L 21/02063 257/E21.577 |
| 8,481,423 | B2 * | 7/2013 | Arnold | H01L 21/02063 257/E21.577 |
| 8,575,039 | B2 * | 11/2013 | Yamaguchi | H01L 21/0271 257/E21.259 |
| 8,748,325 | B2 * | 6/2014 | Horikawa | H01L 21/02118 428/473.5 |
| 2001/0005528 | A1 * | 6/2001 | Lee | C07C 211/54 427/248.1 |
| 2009/0137043 | A1 * | 5/2009 | Parsons | C23C 16/01 435/398 |
| 2010/0304160 | A1 * | 12/2010 | Fukukawa | C08G 73/1007 428/458 |
| 2011/0003078 | A1 * | 1/2011 | Sugita | H01L 21/02126 427/301 |
| 2012/0015525 | A1 | 1/2012 | Endo et al. | |

FOREIGN PATENT DOCUMENTS

| | | |
|---|---|---|
| JP | 2008-032160 | 2/2008 |
| JP | 2012-15195 | 1/2012 |
| TW | 201209916 | 3/2012 |

* cited by examiner

METHOD FOR DEPOSITING A FILM AND FILM DEPOSITION APPARATUS

TECHNICAL FIELD

The present invention relates to a method for depositing a film and a film deposition apparatus for depositing an insulating film made of a polymer thin film.

BACKGROUND ART

In general, in order to manufacture semiconductor devices, desired devices are manufactured by performing a variety of processes such as a film deposition process, a dry etching process and the like on a substrate such as a semiconductor wafer or the like. However, a line width and a hole diameter are increasingly miniaturized to respond to requirements for further high-integration and fine-miniaturization of semiconductor devices. In fact, in recent years, wire layers have come to have complicated wiring structures such as an eight-layer structure. Furthermore, copper that has low electric resistance and low cost is likely to be used as a wiring material and a filling material because electric resistance needs to be lowered due to the miniaturization of a variety of dimensions (e.g., see Patent Document 1).

When using copper as the wiring material and the filling material, considering adhesion of copper to an under layer thereof and prevention of diffusion of copper, in general, tantalum metal (Ta), titanium (Ti), a tantalum nitriding film (TaN), a titanium nitriding film (TiN) or the like is interposed as a barrier layer.

In this regard, a description is given below with reference to FIGS. 1A and 1B. FIGS. 1A and 1B are diagrams for illustrating a part of a conventional filling process for filling a recess of an object to be processed. FIG. 1A illustrates a part of a process in the middle of forming a TSV (Through Silicon Via) structure used in mounting an integrated circuit three-dimensionally.

In the object to be processed 2 illustrated in FIG. 1A, a semiconductor device (not shown in the drawing) such as a transistor and a conductive layer 6 constituting a wiring layer of the semiconductor device are formed in a surface of a substrate 4 made of a disk-shaped silicon substrate about 0.7 mm thick, and the whole surfaces of this semiconductor device and the conductive layer 6 are covered with a protective insulating layer 8. Moreover, in the object to be processed 2, the thickness of the substrate 4 is thinned up to about 0.1 mm by grinding the back surface (back grinding) of the substrate 4; the substrate is turned upside down; and a recess 10 is formed by etching the substrate 4 from the back surface side (upper side in the drawing) to the conductive layer 6.

In the bottom of the recess 10, the conductive layer 6 is exposed. This recess 10 becomes a through-hole for contact with an extraction electrode of a semiconductor device, a via-hole for connecting interconnections with each other and the like. Moreover, in order to perform a three-dimensional mounting, the recess is filled with a copper film for conduction when a semiconductor device and the like are further formed on the upper surface side of the reversed substrate 4. In this case, prior to forming the copper film, as illustrated in FIG. 1B, an insulating film 12 is deposited on the whole surface and a whole side wall inside the recess 10 to ensure insulation properties to the substrate 4, and a barrier film 14 for preventing the copper diffusion is deposited on the insulating film 12. After that, the recess 10 is filled by depositing a filling metal film 16.

Here, for example, SiO₂ film made of TEOS (Tetraethyl orthosilicate) is used as the insulating film 12. Ti, Ta, a nitriding film thereof (TiN, TaN) or the like is used as the barrier film 14. For example, a copper film is used as the filling metal film 16.

In the meantime, because of requirements of further high-integration, fine-miniaturization and high-performance of the semiconductor devices these days, the line width and the hole diameter are increasingly miniaturized and the recess has a high aspect ratio, which makes it impossible to deposit a barrier film that has sufficient barrier properties by the conventional method.

Therefore, recently, using a polymer thin film such as polyimide (resin) or the like as the barrier film 14 or an insulating film has been proposed (e.g., see Patent Documents 2 and 3). In order to form the polymer thin film, a wet process that polymerizes raw materials with each other by dissolving the raw materials in a solvent and performing spin coating and a vapor deposition polymerization that polymerizes raw materials evaporated in a vacuum atmosphere, are known.

PRIOR ART DOCUMENTS

Patent Documents

Patent Document 1: Japanese Laid-Open Patent Application Publication No. 2000-077365
Patent Document 2: Japanese Laid-Open Patent Application Publication No. 2001-085419
Patent Document 3: Japanese Laid-Open Patent Application Publication No. 2008-032160

SUMMARY OF THE INVENTION

Problem to be Solved by the Invention

However, in the wet process of the conventional methods for depositing a polymer thin film, it is difficult to deposit the thin film sufficiently inside the recess such as the hole having a high aspect ratio. Also, it is difficult for the vapor deposition polymerization to prevent the copper from diffusing because the barrier properties of the polymer thin film are not sufficient.

The present disclosure focuses on the above discussed problems, and is created to efficiently solve the problems. An embodiment of the present invention is a method for depositing a film and a film deposition apparatus that can be applied to filling a recess having a high aspect ratio, and can provide an insulating film made of a polymer thin film having barrier properties.

Means for Solving the Problem

According to an embodiment of the present invention, there is provided a method for depositing a film. In the method, an object to be processed is accommodated in a process chamber, and an insulating film made of a polymer thin film is deposited on a surface of the object to be processed by supplying a first source gas composed of an acid anhydride and a second source gas composed of a diamine into the process chamber that is evacuated. Next, the insulating film is modified so as to have a barrier function by stopping the supply of the second source gas into the process chamber and continuously supplying the first source gas into the process chamber.

According to another embodiment of the present invention, there is provided a film deposition apparatus that includes a process chamber configured to accommodate an object to be processed, a holding unit configured to hold the object to be processed in the process chamber, an evacuation system configured to evacuate the process chamber, a first gas supply unit configured to supply a first source gas composed of an acid anhydride into the process chamber, a second gas supply unit configured to supply a second source gas composed of a diamine into the process chamber, a heating unit configured to heat the object to be processed, and an apparatus control unit configured to control the whole film deposition apparatus. The apparatus control unit performs first control of causing the first gas supply unit to supply the first source gas and causing the second gas supply unit to supply the second source gas so as to deposit an insulating film on a surface of the object to be processed. Next, the apparatus control unit performs second control of causing the first gas supply unit to continuously supply the first source gas and causing the second gas supply unit to stop supplying the second source gas.

Advantageous Effect of the Invention

According to a method for depositing a film and a film deposition apparatus of an embodiment of the present invention, by performing modification of an insulating film, the insulating film is caused to have barrier properties. This makes it possible to form an insulating film made of a polymer thin film that can be applied to filling of a recess having a high aspect ratio and has barrier properties.

EMBODIMENTS FOR IMPLEMENTING THE INVENTION

Figure 2:
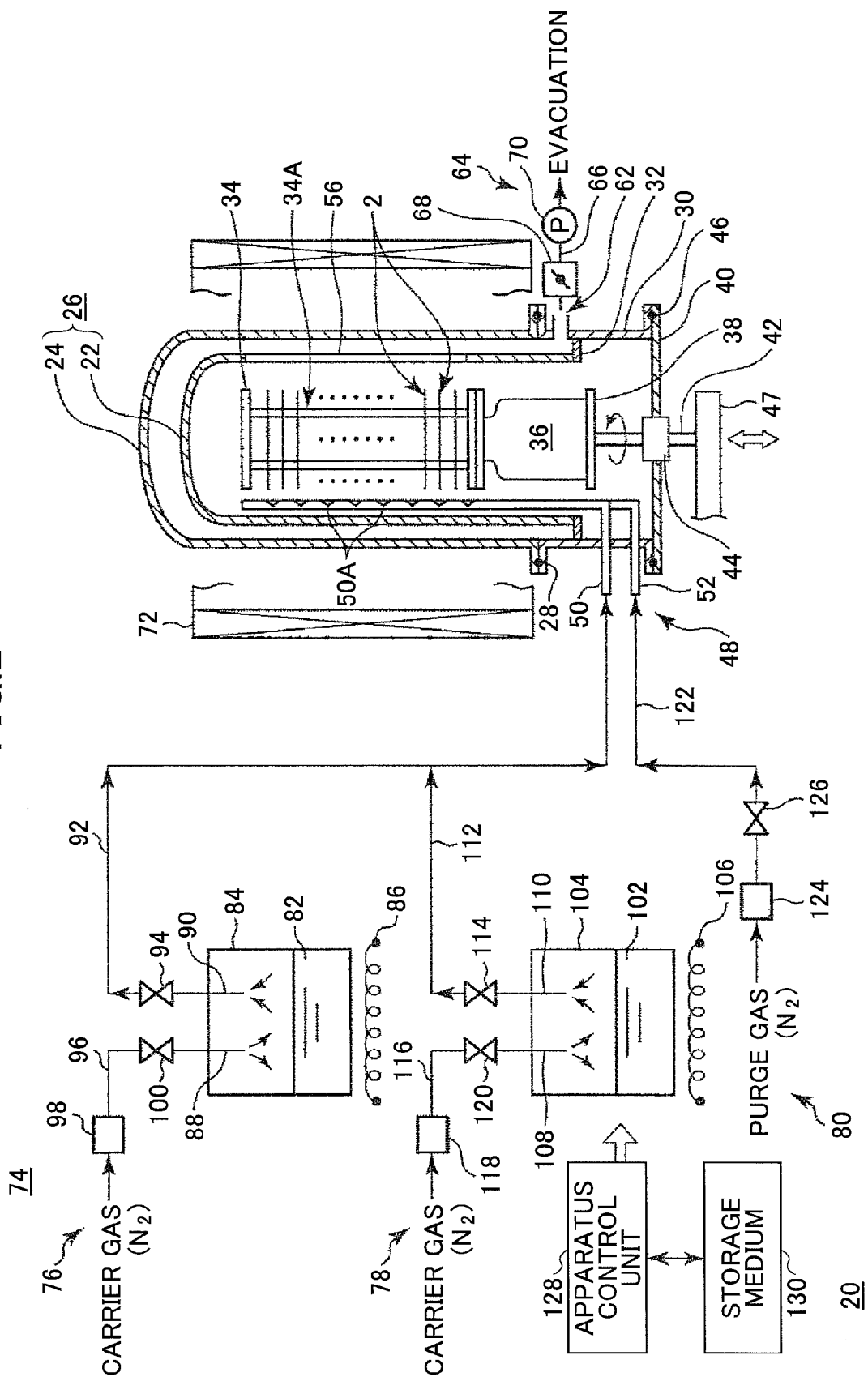
FIG. 2 is a vertical cross-sectional configuration diagram illustrating an example of a film deposition apparatus according to an embodiment of the present invention.
Figure 3:
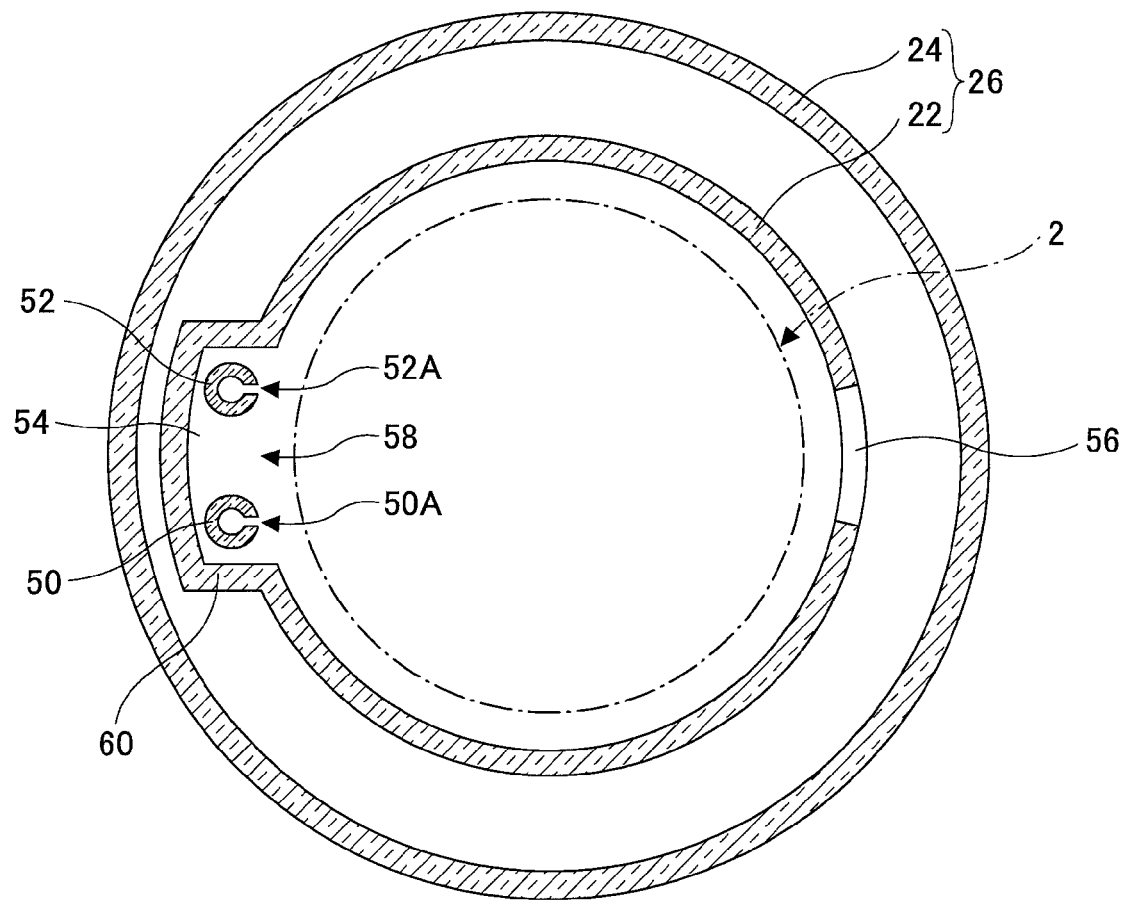
FIG. 3 is a transverse cross-sectional configuration diagram illustrating the film deposition apparatus (heating unit is omitted)

In the following, embodiments of the present invention are described with reference to the accompanying drawings. FIG. 2 is a vertical cross-sectional configuration diagram illustrating an example of the present invention, and FIG. 3 is a transverse cross-sectional configuration diagram illustrating a film deposition apparatus (heating unit is omitted).

As illustrated in FIG. 2, the film deposition apparatus 20 includes a process chamber 26 having a double cylindrical structure constituted of an inner cylinder 22 having a cylindrical body with a centroclinal ceiling and an outer cylinder 24 having a cylindrical body with a centroclinal ceiling and arranged outside the inner cylinder 22. The inner cylinder 22 and the outer cylinder 24 are both made of a heat-resistant material, for example, quartz. A lower end of the process chamber 26 is coupled to a manifold 30 having a cylindrical body, for example, made of a stainless steel through a seal member 28 such as an O-ring, and is supported by the manifold 30. The lower end of the inner cylinder 22 is supported by a holding ring 32 attached to an inner wall of the manifold 30. Here, there is an apparatus including a process chamber all of which are made of quartz having a cylindrical shape without providing the manifold made of stainless steel.

The manifold 30 is formed into a cylindrical shape, and a wafer boat 34 made of quartz is provided to be movable up and down and attachable and detachable, as a holding unit capable of holding a plurality of objects to be processed 2 having a disk-like shape from a lower portion of the manifold 30 by placing the plurality of objects to be processed 2 in a multi-stage separated stacking manner. In the case of the embodiment, the wafer boat 34 is configured to be able to hold, for example, the number of about 50 to 150 objects to be processed 2 having a diameter of 300 mm at almost equal pitch on pillars 34a.

This wafer boat 34 is placed on a table 38 through a heat insulating cylinder 36 made of quartz, and the table 38 is held on a rotating shaft 42 penetrating a lid part 40 made of, for example, stainless steel that opens and closes an opening located at a lower end of the manifold 30. Moreover, a magnetic fluid seal 44, for example, is provided at a penetrating portion of the rotating shaft 42 and maintains sealing inside the process chamber 26.

The above rotating shaft 26 is fixed to an end of an arm 47 supported by an elevating mechanism (not shown in the drawing) such as a boat elevator and the like, and is configured to be able to insert and remove the wafer boat 34 and the lid part 40 integrally into and from the process chamber 26 by moving up and down the wafer boat 34 and the lid part 40 together. Here, by fixing the table 38 to the lid part 40 side, the object to be processed 2 may be processed without rotating the wafer boat 34. A gas introduction part 48 is provided at the process chamber 26.

More specifically, the gas introduction part 48 includes a plurality of, here, two gas diffusion nozzles 50 and 52 that are made of quartz tubes and penetrate through the side wall of the manifold 30, bend and extend upward. A plurality of (a lot of) gas discharge holes 50A and 52A is formed in each of the gas diffusion nozzles 50 and 52 along a lengthwise direction thereof at a predetermined interval, and each of the gas diffusion nozzles 50 and 52 is configured to be able to discharge gas uniformly toward a horizontal direction from each of the gas discharge holes 50A and 52A.

In the meantime, a nozzle accommodation concave portion 54 (see FIG. 3) is formed in a part of the side wall of the inner cylinder 22 of the process chamber 26 along a height direction thereof. Furthermore, an exhaust opening 56 is provided opposite the nozzle accommodation concave portion 54 in the process chamber 26 to evacuate the inside atmosphere. This exhaust opening 56 may be formed, for example, into a long and narrow shape by scraping off a part of the side wall in a vertical direction, or may be configured by forming many slits extending a lateral direction and arranged in the vertical direction. More specifically, the nozzle accommodation concave portion 54 is formed by forming a long and narrow opening 58 in the vertical direction by scrapping off the side wall of the process chamber 26 at a predetermined width along the vertical direction at first, and then by hermetically welding a vertically long and thin compartment wall 60 that is made of, for example, quartz and configured to have a concave cross-sectional shape on the outer wall of the inner cylinder 22. As illustrated in FIG. 3, each of the gas diffusion nozzles 50 and 52 is provided in the nozzle accommodation concave portion 54 side by side.

In addition, a gas outlet 62 communicated with the exhaust opening 56 is formed in the side wall above the holding ring 32 of the manifold 30, and an atmosphere inside the inner cylinder 22 is exhausted to a clearance between the inner cylinder 22 and the outer cylinder 24 through the exhaust opening 56 so as to reach the gas outlet 62. Moreover, an evacuation system 64 is provided at the gas outlet 62. This evacuation system 64 includes an exhaust passage 66 connected to the gas outlet 62. A pressure regulating valve 68 and a vacuum pump 70 are provided in the middle of the exhaust passage 66 so as to evacuate the process chamber 26 while maintaining a predetermined pressure. Furthermore, a cylindrical heating unit 72 configured to heat the process chamber 26 and the object to be processed 2 therein is provided so as to enclose an outer circumference of the process chamber 26.

Moreover, a gas supply unit 74 is provided to supply a necessary gas for a film deposition process to the process chamber 26. Here, the gas supply unit 74 includes a first source gas supply system 76 that supplies a first source gas, a second source gas supply system 78 that supplies a second source gas, and a purge gas supply system 80 that supplies a purge gas. More specifically, the first source gas supply system 76 includes a first raw material storage tank 84 that stores a first raw material 82 composed of an acid anhydride that is in a liquid state at room temperature. This first raw material storage tank 84 is also called an ampoule or a reservoir.

At least one material selected from a group consisting of, for example, pyromellitic anhydride, oxydiphthalic anhydride, biphthalicanhydride, carbonyldiphthalic anhydride, diphthalic anhydride, sulfonyldiphthalic anhydride, cyclohexanetetracarboxylic dianhydride, cyclopentanetetracarboxylic dianhydride, and cyclobutanetetracarboxylic dianhydride can be used as the acid anhydride that is the first raw material 82. Here, pyromellitic anhydride (PMDA) is used. A raw material heater 86 is provided for the first raw material storage tank 84 to form the first source gas by heating and vaporizing the first raw material 82 within a range in which the first raw material 82 is not pyrolyzed. Here, for example, the raw material heater 86 heats the first raw material 82 in a range of about 200 to 260 degrees C.

Furthermore, the first raw material storage tank 84 includes a gas supply part 88 that supplies a carrier gas to carry the first source gas and a gas effluent part 90 that lets out the first source material gas accompanied by the carrier gas. Here, the gas supply part 88 and the gas effluent part 90 are both provided in a ceiling of the first raw material storage tank 84.

In addition, a first source gas passage 92 is provided to couple the gas effluent part 90 of the first raw material storage tank 84 to the gas diffusion nozzle 50 that is one of the two of the gas diffusion nozzles 50 and 52 of the gas introduction part 48 provided in the process chamber 26. Moreover, an on-off valve 94 is provided in the middle of the first source gas passage 92 so as to control a flow of the first source gas.

Furthermore, the gas effluent part 90 on the upstream side of the first source gas passage 92 is located to face down an upper space inside the first raw material storage tank 84 so as to be able to let out the first source gas generated here with the carrier gas. A passage heater (not shown in the drawing) such as a tape heater and the like is provided along the first source gas passage 92, and prevents the first source gas from liquefying and becoming solidified by heating the first source gas passage 92 up to, for example, about 260 to 300 degrees C.

In addition, a carrier gas passage 96 is connected to a gas supply part 88 of the first material storage tank 84 in order to introduce the carrier gas into the first raw material storage tank 84. A gas supply opening of the gas supply part 88 is located to face down the upper space inside the first raw material storage tank 84. Moreover, a flow rate controller 98 such as a mass flow controller for controlling a gas flow rate from an upstream side toward a downstream side and an on-off valve 100 are sequentially provided in the middle of the carrier gas passage 96. Here, although $N_2$ gas is used as the carrier gas, the carrier gas is not limited to $N_2$ gas, and another noble gas, for example, He, Ar or the like may be used.

Furthermore, the second source gas supply system 78 includes a second raw material storage tank 104 storing a second raw material 102 composed of a diamine that is in a liquid state at room temperature. This second raw material storage tank 104 is also called an ampoule or a reservoir.

At least one material selected from a group consisting of, for example, oxydianiline, decanediamine, ethylenediamine, diaminoundecan, trimethylenediamine, diaminododecane, diaminobutane, hexafluoropropane, diaminopentane, thiodianiline, aminophenyl sulfide, diaminohexane, diaminophenylphenyl sulfone, heptanediamine, diaminobenzophenone, diaminooctane, diaminononane, diaminodicyclohexylmethane, and methylcyclohexanamine can be used as the diamine that is the second raw material 102. Here, oxydianiline (ODA) is used. A raw material heater 106 is provided at the second raw material storage tank 104. The raw material heater 106 serves to form the second source gas by heating and vaporizing the second raw material 102 within a range in which the second raw material 102 is not pyrolyzed. The raw material heater 106 is heated, for example, up to about 130 to 220 degrees C.

In addition, the second raw material storage tank 104 includes a gas supply part 108 that supplies a carrier gas to carry the second source gas and a gas effluent part 110 that lets out the second source gas accompanied by the carrier gas. Here, the gas supply part 108 and the gas effluent part 100 are both provided in a ceiling of the second raw material storage tank 104.

Moreover, a second source gas passage 112 is provided to couple the gas effluent part 110 of the first raw material storage tank 84 to the gas diffusion nozzle 50 that is one of the two of the gas diffusion nozzles 50 and 52 of the gas introduction part 48 provided in the process chamber 26. Here, the first source gas passage 92 and the second source gas passage 112 are connected to each other at the downstream side and become a common passage commonly used so as to mix the first source gas and the second source gas with each other along the way. Furthermore, an on-off valve 114 is provided in the middle of the second source gas passage 112 so as to control a flow of the second source gas.

In addition, the gas effluent part 110 on the upstream side of the second source gas passage 112 is located to face down an upper space inside the second raw material storage tank 104 so as to be able to let out the first source gas generated here with the carrier gas. A passage heater (not shown in the drawing) such as a tape heater and the like is provided along the second source gas passage 112, and prevents the second source gas from liquefying and becoming solidified by heating the second source gas passage 112 up to, for example, about 260 to 300 degrees C.

In addition, a carrier gas passage 116 is connected to a gas supply part 108 of the second material storage tank 104 in order to introduce the carrier gas into the second raw material storage tank 104. A gas supply opening of the gas supply part 108 is located to face down the upper space inside the second raw material storage tank 104. Moreover, a flow rate controller 118 such as a mass flow controller for controlling a gas flow rate from an upstream side toward a downstream side and an on-off valve 100 are sequentially provided in the middle of the carrier gas passage 116. Here, although $N_2$ gas is used as the carrier gas, the carrier gas is not limited to $N_2$ gas, and another noble gas, for example, He, Ar or the like may be used.

Moreover, the purge gas supply system 80 includes a purge gas passage 122 connected to the other gas diffusion nozzle 52. In the middle of the purge gas passage 122, a flow rate controller 124 such as a mass flow controller and a on-off valve 126 are sequentially provided, and are configured to supply the purge gas while controlling a flow rate thereof as necessary. For example, an inactive gas such as $N_2$ gas or the like is used as the purge gas.

Here, by mixing the first source gas and the second source gas with each other along the way, the mixed gas is discharged from the single gas diffusion nozzle 50. However, the embodiments are not limited to this embodiment, but the first source gas and the second source gas may be mixed with each other in the process chamber by providing another gas diffusion nozzle and by connecting the first and second source gas passages 92 and 112 to the two of the gas diffusion nozzles, respectively.

A whole operation of the film deposition apparatus 20 configured as the above is controlled by an apparatus control unit 128, for example, constituted of a computer and the like, and a program of the computer that implements the operation is stored in a storage medium 130. This storage medium 130 is constituted of, for example, a flexible disk, a CD (Compact Disc), a hard disk, a flash memory, a DVD or the like. More specifically, the start and stop of supplying each gas, flow rate control, control of a process temperature and a process pressure and the like are performed in accordance with instructions from the apparatus control unit 128.

Figure 4:
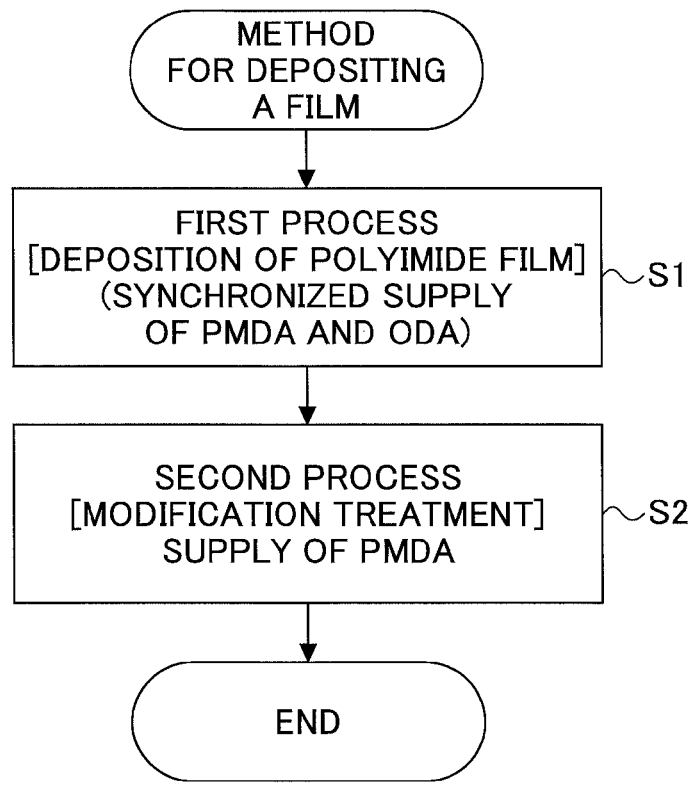
FIG. 4 is a diagram for illustrating a flow of a method for depositing a film according to an embodiment of the present invention.

Next, a description is given below of a method for depositing a film by using the film deposition apparatus 20 configured as the above, with reference to FIGS. 4 through 6B. FIG. 4 is a process diagram illustrating a flow of the method for depositing the film of the present invention. FIGS. 5A through 5E are cross-sectional views illustrating filling states of a recess of an object to be processed. FIGS. 6A and 6B are explanation drawings for explaining states of a polyimide film after and before a modification process. Here, a description is given below by citing an example of using PMDA as the first raw material 82, using ODA as the second raw material 102, and depositing a polyimide film as a polymer thin film by a vapor deposition polymerization method.

To begin with, a method according to an embodiment of the present invention performs a first process S1 of depositing an insulating film by supplying a first source gas composed of an acid anhydride and a second source gas composed of a diamine and a second process S2 of stopping the supply of the second source gas after the first process S1 and supplying the first source gas so as to have a barrier function by modifying the insulating film. Here, as discussed above, the polyimide film that is the insulating film having the barrier function is deposited by using PMDA as the acid anhydride that is the first raw material 82 and using ODA as the diamine that is the second raw material 102.

When supplying the first source gas, in the first source gas supply system 76, the first raw material 82 is vaporized and goes into a saturated state within the first raw material storage tank 84 by heating. By supplying a carrier gas into the first raw material storage tank 84 in the saturated state at a controlled flow rate, the first source gas in the saturated state flows out of the first raw material storage tank 84 toward the first source gas passage 92 side accompanied by the carrier gas. Then, the first source gas carried with the carrier gas is supplied into the process chamber 26 by being discharged from the gas diffusion nozzle 50.

Moreover, when supplying the second source gas, in the second source gas supply system 78, the second raw material 102 is vaporized and in a saturated state within the second raw material storage tank 104 by heating. By supplying a carrier gas into the second raw material storage tank 104 in the saturated state at a controlled flow rate, the second source gas in the saturated state flows out of the second raw material storage tank 104 toward the second source gas passage 112 side accompanied by the carrier gas. Then, the second source gas carried with the carrier gas is supplied into the process chamber 26 by being discharged from the gas diffusion nozzle 50.

Here, because the first and second source gas passages 92 and 112 are connected together along the way, when the first source gas and the second source gas are flowing, both of the first and second source gases are mixed together along the way and the mixed gas is supplied into the process chamber 26.

The gas supplied into the process chamber 26 flows in a lateral direction (horizontal direction) through spaces between the objects to be processed 2 while contacting the objects to be processed 2 accommodated therein and further flows into the clearance between inner cylinder 22 and the outer cylinder 24 through the exhaust opening 56. Furthermore, the gas flows down in the clearance and is exhausted from the gas outlet 62 to the outside of the process chamber 26 by the evacuation system 64.

In an actual procedure, to begin with, a wafer boat 34 holding many, for example, the number of 50 to 150 objects to be processed 2 having a diameter of 300 mm under room temperature is loaded into the process chamber 26 preliminarily set at a predetermined temperature from a bottom thereof. Next, the process chamber 26 is sealed by closing the opening at the lower end of the manifold 30 with the lid part 40.

Figure 1A:
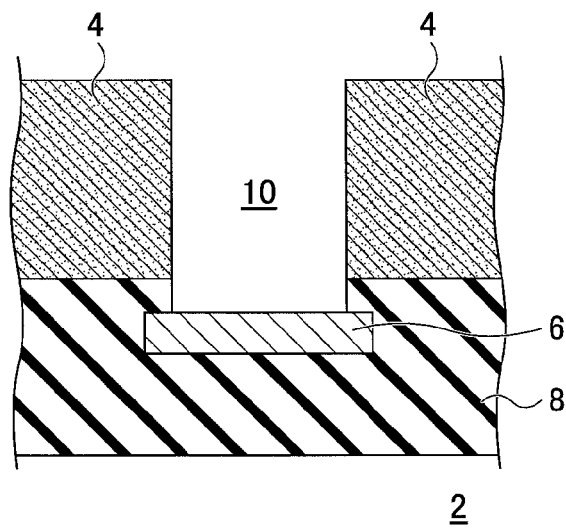
FIG. 1A is a first diagram for explaining a part of a conventional filling process of a recess of an object to be processed.
Figure 1B:
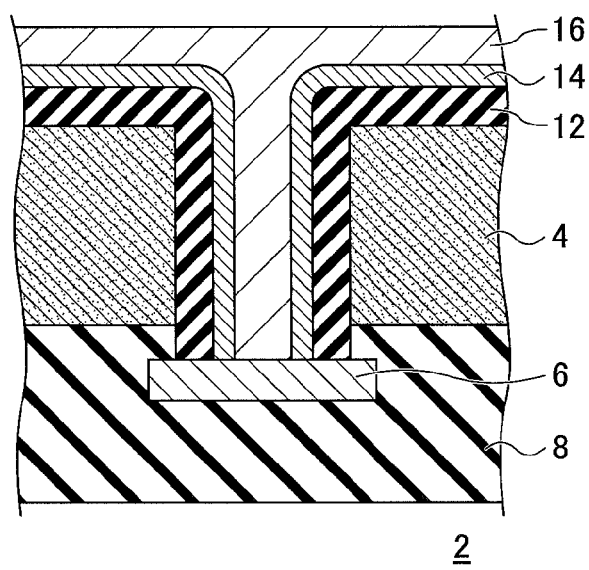
FIG. 1B is a second diagram for explaining a part of the conventional filling process of the recess of the object to be processed.
Figure 5A:
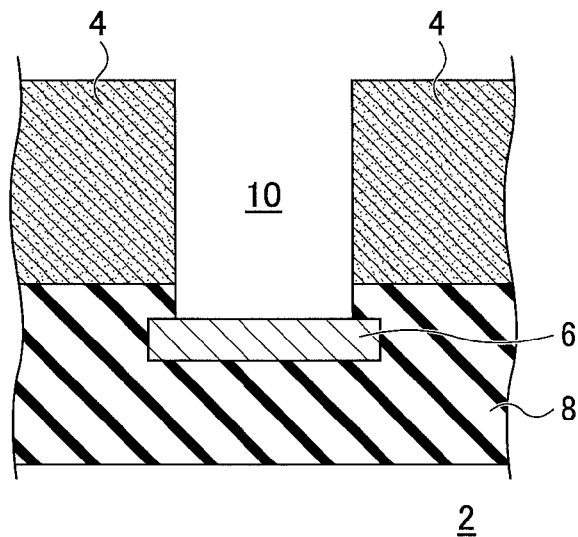
FIG. 5A is a first cross-sectional view illustrating a filling state of a recess of an object to be processed.
Figure 6A:
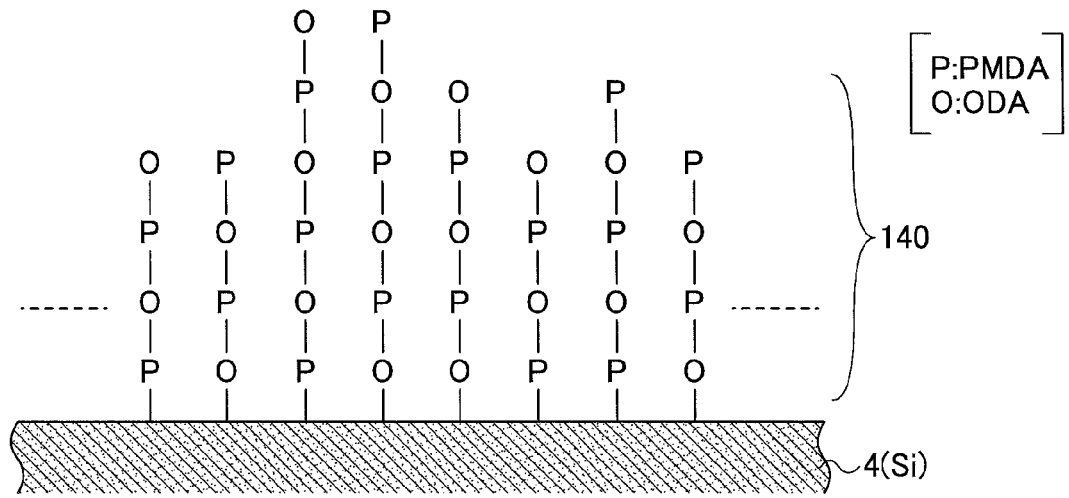
FIG. 6A is an explanation drawing explaining a state prior to a modification process of a polyimide film.
Figure 6B:
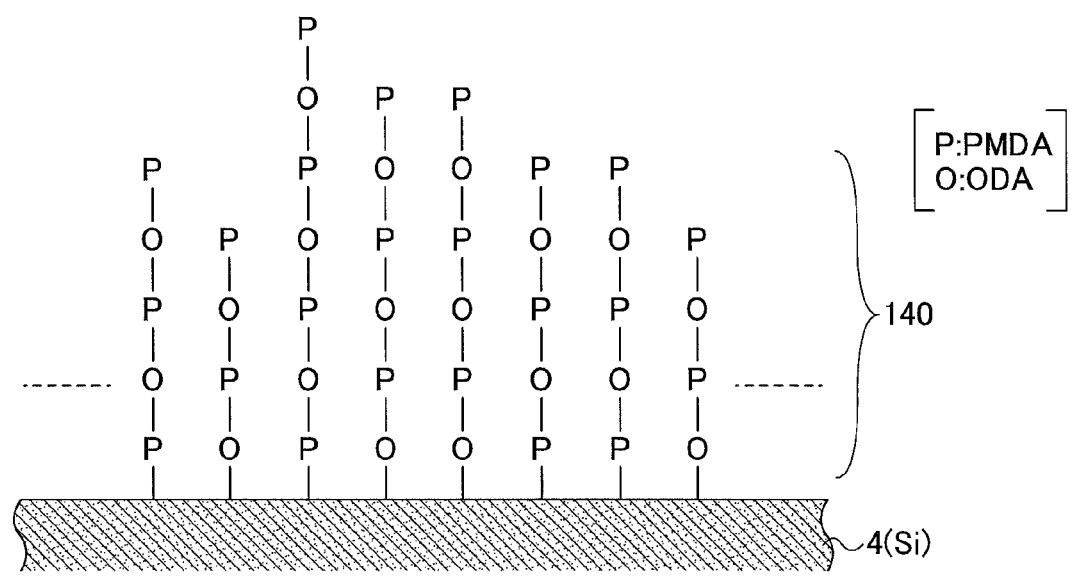
FIG. 6B is an explanation drawing explaining a state after the modification process of the polyimide film.

Here, as illustrated in FIG. 5A, the object to be processed 2 has a recess 10 for filling formed in a surface thereof. The object to be processed 2 is the same as one described above with reference to FIG. 1A. In other words, the object to be processed 2 is obtained by forming a semiconductor device such as a transistor and the like (not shown in the drawing) and a conductive layer 6 such as a wiring layer of the semiconductor device in a surface of a substrate 4 made of a silicon substrate and the like having a disk-like shape and a thickness of, for example, about 0.7 mm, and by covering the whole surface of the semiconductor device and the conductive layer 6 with a protective insulating layer 8. In addition, the recess 10 is formed by thinning the substrate 4 up to about 0.1 mm by grinding the back surface (back grinding) of the substrate 4, turning the substrate 4 upside down, and etching the substrate 4 from the back surface side (upper side in FIG. 5A) to the conductive layer 6.

Accordingly, the bottom of the recess 10 is constituted of the exposed conductive layer 6, and the recess 10 becomes a through-hole for contacting an extraction electrode of the semiconductor device, a via hole for connecting interconnection layers with each other and the like. This recess 10 has a diameter of about 5 μm, a depth of about 50 μm and a high aspect ratio of about 10.

Then, after accommodating the objects to be processed 2 as described above in the process chamber 26, while the pressure in the process chamber 26 is maintained within a range of about 0.1 to 1.0 Torr by evacuating the process chamber 26, a wafer temperature is increased by increasing supply power to the heating unit 72, and then a process temperature in the process chamber 26 is maintained within a range of, for example, 20 to 450 degrees C. (heatproof temperature of polyimide). After that, each gas is supplied from each of the first source gas supply system 76 and the second source gas supply system 104 of the gas supply unit 74 as described above.

Figure 5B:
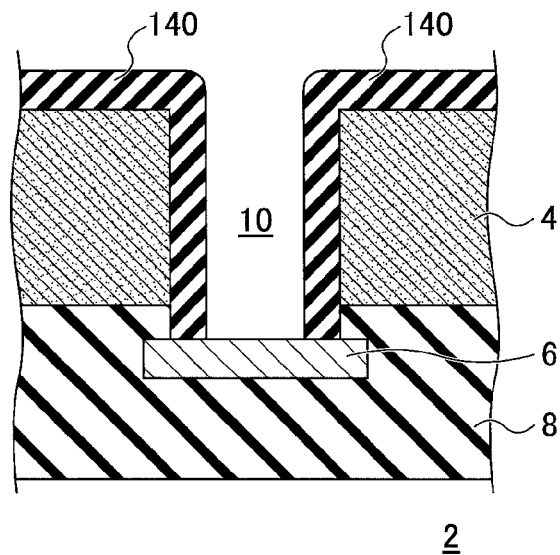
FIG. 5B is a second cross-sectional view illustrating a filling state of the recess of the object to be processed.

According to an embodiment of the present invention, as discussed above, the first process S1 and the second process S2 are sequentially performed. In the first process S1, as illustrated in FIG. 5B, the insulating film 140 made of the polymer thin film is deposited by supplying PMDA of the first source gas and ODA of the second source gas and by polymerizing the first and second source gases with each other by a vapor polymerization method. The insulating film 140 is a polyimide film. In this case, the first source gas and the second source gas may be supplied at the same time, or the first source gas and the second source gas may be supplied alternately and repeatedly.

Figure 5C:
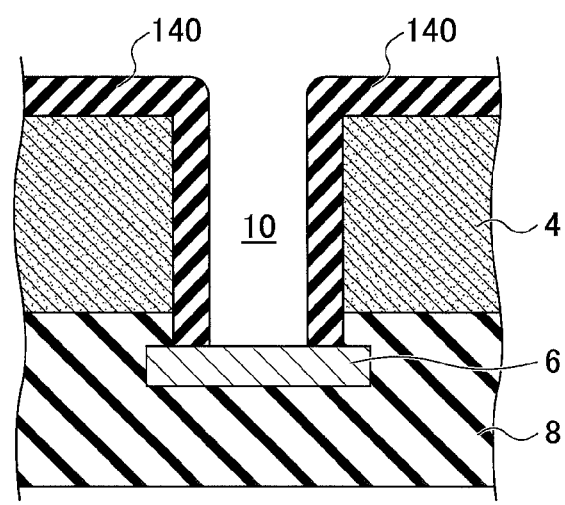
FIG. 5C is a third cross-sectional view illustrating a filling state of the recess of the object to be processed.

After depositing the insulating film 140, subsequently, the process is changed to the second process S2. In the second process S2, the supply of ODA gas is stopped by closing the on-off valve 114 of the second source gas passage 114, and a modification process of the insulating film 140 is performed by continuously supplying PMDA gas as illustrated in FIG. 5C. In other words, in the second process S2, a post flow process is performed by stopping the supply of ODA gas and continuously supplying PMDA gas. This causes the surface of the insulating film 140 to be modified and become a PMDA termination end, thereby forming the insulating film 140 having a barrier function.

With respect to process conditions, the process temperature in the process chamber 26 is in a range of 20 to 450 degrees C. (heatproof temperature of polyimide) as described above, preferably in a range of 130 to 200 degrees C., and the process pressure in the process chamber 26 is in a range of 0.1 to 1.0 Torr (13 to 133 Pa), preferably in a range of 0.2 to 0.4 Torr. Also, with respect to gas flow rates, flow rates of the carrier gas in the first process S1 and the second process S2 are in a range of 0.8 to 1.5 liter/minute, respectively, and here, are 0.9 liter/minute, respectively. A process time is in a range of 5 to 30 minutes, preferably in a range of 5 to 15 minutes. Here, for example, each process is performed for about 10 minutes.

The process time shorter than 5 minutes in the second process S2 is not preferable because the modification of the insulating film 140 is not sufficient, and the process time longer than 30 minutes not only causes the modification to be saturated but also decreases throughput because the modification time is too long. Moreover, a film deposition rate is in a range of 20 to 50 nm/minute. Furthermore, a target film thickness of the insulating film 140 is in a range of 250 to 500 nm, which makes it possible to remove necessity of forming the barrier layer that was conventionally used.

Figure 5D:
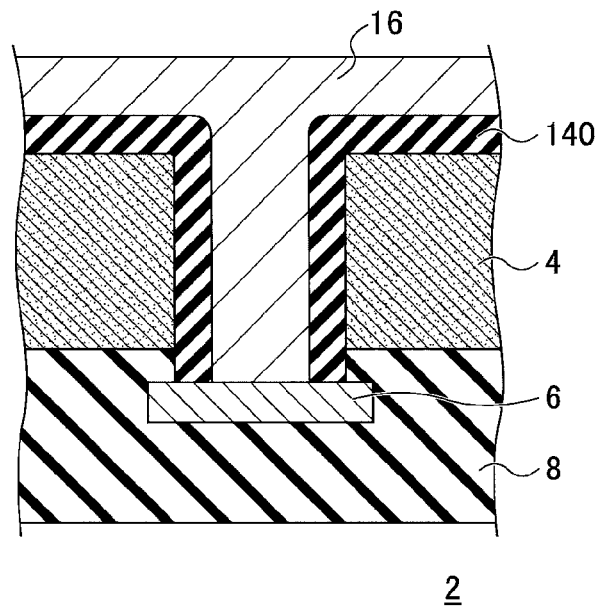
FIG. 5D is a fourth cross-sectional view illustrating a filling state of the recess of the object to be processed.
Figure 5E:
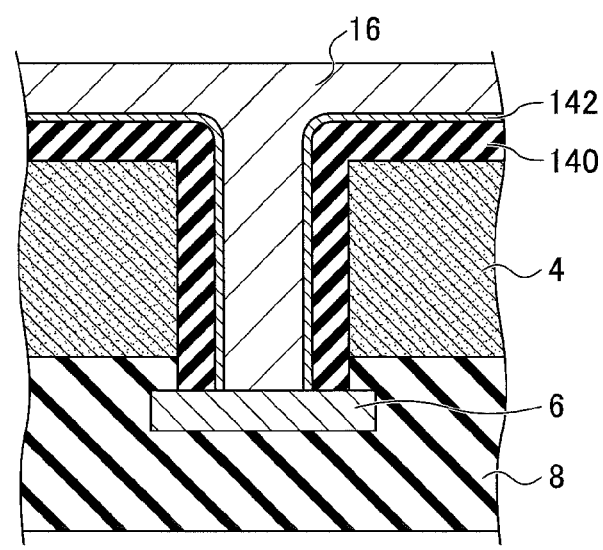
FIG. 5E is a fourth cross-sectional view illustrating a filling state of the recess of the object to be processed.

As discussed above, after ending the second process S2, in order to fill the recess 10 with filling metal, as illustrated in FIG. 5D, a copper film is deposited as a filling metal film 16 by a CVD process, a plating process or the like so as to fill the recess 10 after forming, for example, a seed layer of copper. After that, an excess of copper film on the surface of the object to be processed 2, which is the filling metal film 16, is removed by a polishing process such as a CMP (Chemical Mechanical Polishing) process or the like.

Here, in the film deposition process, in order to improve the barrier properties to the copper film, as illustrated in FIG. 5F as a modification example, a conventionally utilized barrier film 142 is formed on an upper layer of the modified insulating film 140, and then the filling metal film 16 such as copper or the like may be deposited after forming the seed layer as described above. In this case, the barrier film 142 can be formed thinner than the conventional cases. As mentioned above, a Ti film, a Ta film or a nitriding film thereof is used as the barrier film 142.

<Modification of Insulating Film (Polyimide Film)>

Here, a description is given below of a change due to the modification of an interface (surface) of the polyimide film that is the insulating film 140 with reference to FIGS. 6A and 6B. In FIGS. 6A and 6B, "P" shows a PMDA molecule, and "O" shows an ODA molecule. To begin with, as illustrated in FIG. 6A, at the time when the polyimide film that is the insulating film 140 is deposited by supplying PMDA and ODA in the first process S1, the polyimide film deposited on the substrate 4 by the vapor polymerization method includes portions terminated with "P" and portions terminated with "O" in a mixed manner.

When the modification process is performed by supplying only PMDA (PMDA post flow) on such a polyimide film in the second process S2, as illustrated in FIG. 6B, PMDA polymerizes the portions previously terminated with "O" of ODA and terminates the portions with "P". As a result, almost all portions of the polyimide film that is the insulating film 140 are terminated with "P", thereby causing the insulating film 140 to be able to exert the barrier function to Cu.

In this manner, according to an embodiment of the present invention, in a film deposition method that deposits the insulating film 140 composed of a polymer thin film on the surface of the object to be processed 2 in the evacuated process chamber 26, the insulating film 140 is deposited by supplying the first source gas composed of an acid anhydride and the second source gas composed of a diamine, and the insulating film 140 is caused to have a barrier function by the modification performed by stopping the supply of the second source gas and supplying the first source gas after the first process S1, which makes it possible to form the insulating film 140 made of the polymer thin film that is applicable to a filling of a recess having a high aspect ratio and has barrier properties.

<Examination of Cu Diffusion Resistance to Termination Process of Polyimide Film>

Figure 7:
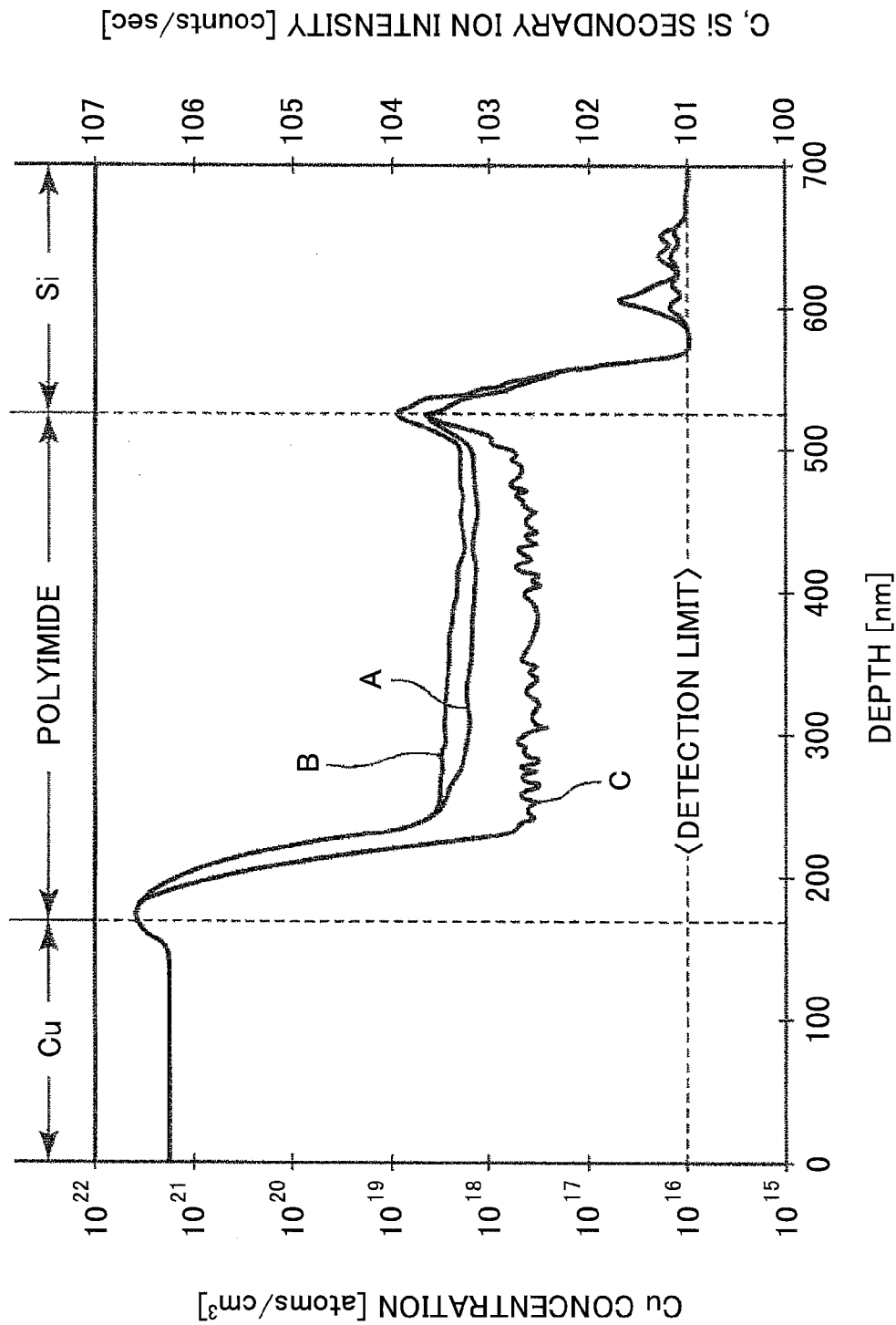
FIG. 7 is a graph illustrating Cu diffusion resistance to a termination process of the polyimide film.

Next, since examination was performed about Cu diffusion resistance of a polyimide film, a description is given below of the result with reference to FIG. 7. FIG. 7 is a graph showing the Cu diffusion resistance to the termination process of the polyimide film. Here, a polyimide film that is a polymer thin film is deposited on a surface of a silicon substrate with a thickness of about 25 µm as a sample, and a Cu film is deposited on a surface of the polyimide film.

A case without having performed any process on the polyimide film before depositing the Cu film (curve A), a case of having formed a polyimide film terminated with ODA by supplying ODA gas to the polyimide film before depositing the Cu film (curve B), and a case of having formed a polyimide film terminated with PMDA by performing a post flow (second process S2) by supplying PMDA gas to the polyimide film before depositing the Cu film (curve C), were examined. The above-mentioned method was used with respect to formation and process of the polyimide film.

In measurement of elements in the samples, SIMS (secondary ion mass spectrometry) was used. The horizontal axis is made a depth; a vertical axis on the left is made a Cu concentration; and a vertical axis on the right is made a secondary ion intensity of Cu and Si. As illustrated in FIG. 7, in the case without performing any process on the polyimide film (curve A) and the case of terminating the polyimide film with ODA by performing the ODA post flow on the polyimide film (curve B), the Cu element diffuses in both of the polyimide films at a relatively high concentration, for example, up to the concentration of about $5\times10^{18}$ atoms/cm$^3$.

In contrast, in the case of terminating the polyimide film with PMDA by performing the PMDA post flow (second process S2) on the polyimide film as the method of the present invention (curve C), the concentration of the Cu element in the polyimide film decreases up to about $5\times10^{17}$ atoms/cm$^3$, which is lower than the cases of the curves A and B by about one order of magnitude. As a result, in the case of the curve C terminating the polyimide film with PMDA, it is noted that the diffusion of the Cu element can be more suppressed than that in the other curves A and B.

<Examination of Cu Diffusion Resistance of Polyimide Film when Using Barrier Film (Ti Film)>

Figure 8A:
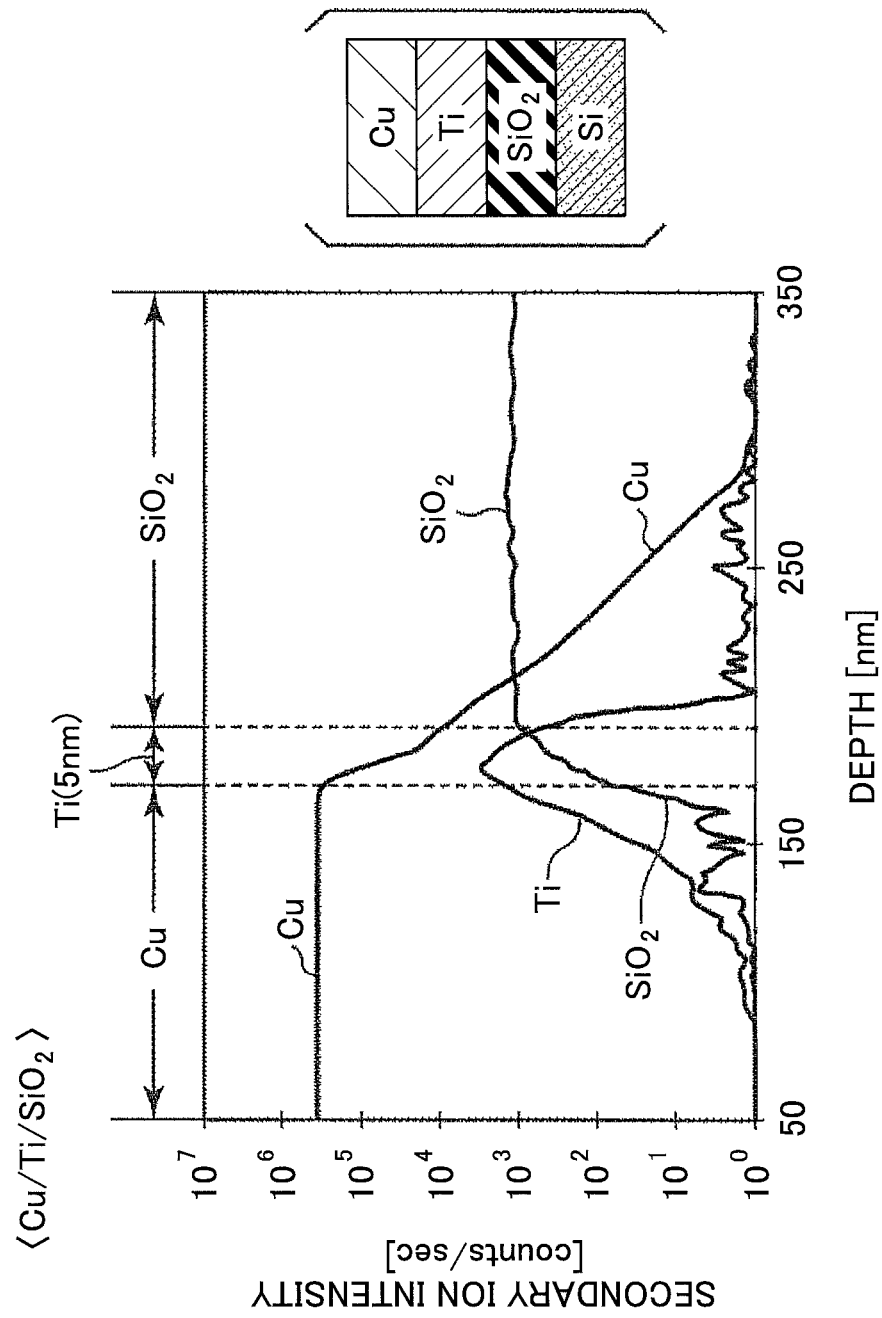
FIG. 8A is a first graph illustrating Cu diffusion resistance to a termination process of the polyimide film when using a barrier film.
Figure 8B:
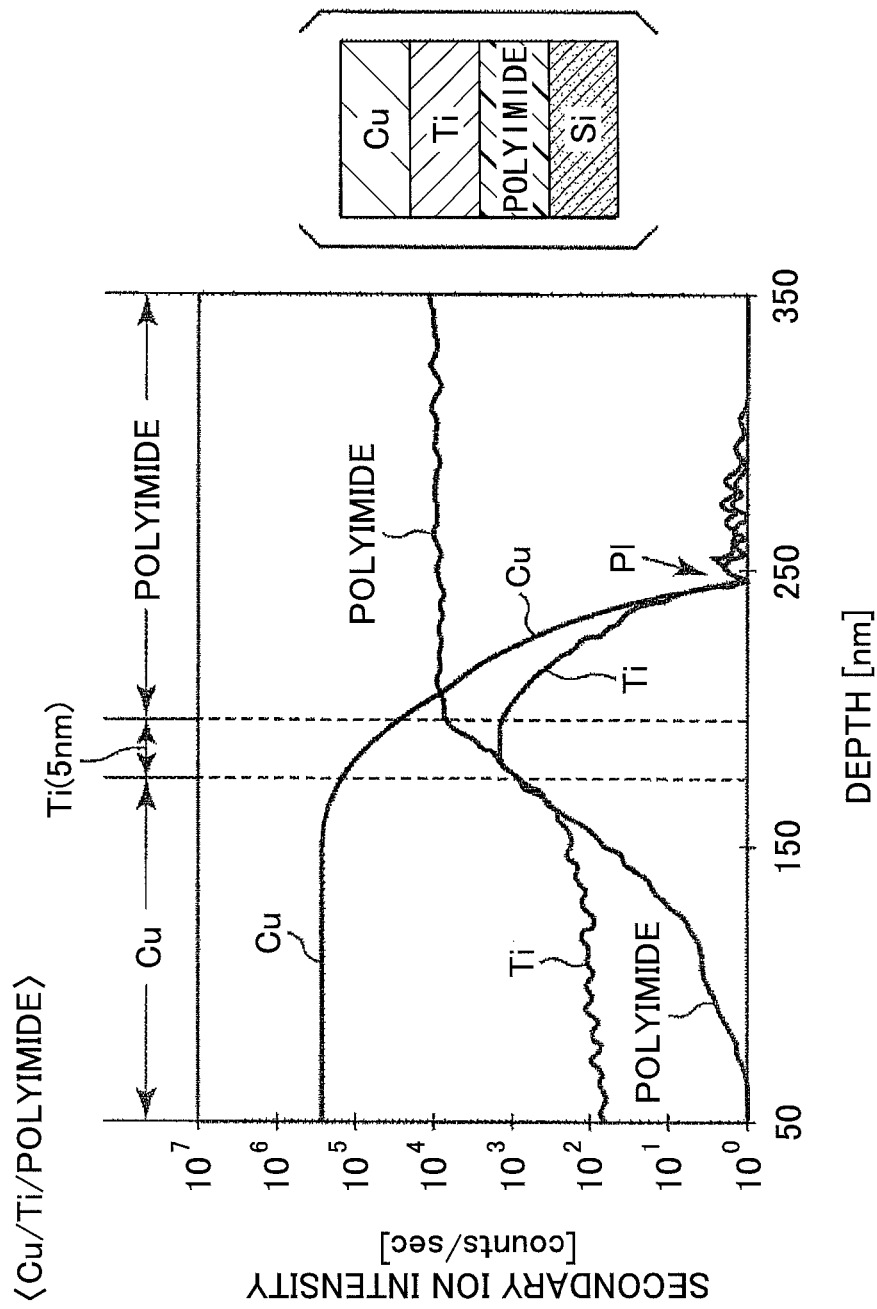
FIG. 8B is a second graph illustrating the Cu diffusion resistance to the termination process of the polyimide film when using the barrier film.

Next, since examination was performed about Cu diffusion resistance when using a barrier film and a polyimide film together, a description is given below of the evaluation result with reference to FIGS. 8A and 8B. FIGS. 8A and 8B are graphs showing the Cu diffusion resistance of the polyimide film when using the barrier film and the polyimide film. FIGS. 8A and 8B illustrate schematic diagrams of laminated states of thin films that became samples together with the graphs.

More specifically, in a case illustrated in FIG. 8A, a SiO$_2$ film, a Ti film that was a barrier film, and a Cu film were sequentially layered on a surface of a silicon substrate. Also, in a case illustrated in FIG. 8B, a polyimide film (polymer thin film, the second process completed) that was deposited by the method according to an embodiment of the present invention, a Ti film that was a barrier film, and a Cu film were sequentially layered on a surface of a silicon substrate. Here, the thickness of the barrier film was 5 nm, which was formed thinner than the thickness of the barrier layers of 50 to 200 nm that were conventionally and generally used in a considerable way.

The horizontal axes of the graphs in FIGS. 8A and 8B show a depth, and the vertical axes show secondary ion intensity. The SIMS was used to measure elements in the samples, and measured secondary ions generated when performing sputter etching from the substrate side. Focusing on the Cu concentration, in the case shown in FIG. 8A, it is noted that Cu element passed through the Ti film that was the barrier film and diffused to a considerably deep position of the SiO$_2$ film, for example, a depth of about 300 nm and that the barrier properties to the Cu diffusion was not enough.

In contrast, in the case shown in FIG. 8B, although Cu element looks to have passed through the Ti film that was the barrier film, diffused into the polyimide film and reached a depth of about 250 nm at the first glance, this was an error caused by properties of the SIMS method that performed the sputter etching in the samples by ions. More specifically, because the polyimide film is much softer than silicon and the Ti film, when performing sputtering from the silicon substrate side (the right hand side in the graph) by ions for sputter etching for measurement, dispersions occurred in depth to which the sputter ions intruded in a depth direction, and part of the sputter ions reached a portion where the Ti film existed from a position of a depth of about 250 nm shown by a point P1, by which Ti element began to be detected.

Here, at the point P1 located at a depth of about 250 nm, Cu element and Ti element began to be detected almost at the same time. This means that the diffusion of Cu element stopped at a border region between the Ti film and the polyimide film, and Cu element did not diffuse to the polyimide film. In other words, because a starting point of detecting Ti element and a starting point of detecting Cu element are almost at the same time, it is noted that Cu element diffused and reached the border region between the Ti film and the polyimide film, but did not diffuse to the polyimide film.

In this way, according to a polyimide film having a modified surface according to an embodiment of the present invention, it is noted that the polyimide film can have a barrier function in addition to insulation properties and exert totally sufficient barrier properties by using a very thin barrier film of about slightly 5 µm together. In other words, by using an insulating film with a barrier function of the present invention, the conventionally used barrier films can be thinner.

Here, in the above embodiments and working examples, a description is given by taking an example of performing a film deposition process and the like on a recess of an object to be processed thinned up to about 0.1 mm by grinding a back surface of a silicon substrate for three-dimensional mounting of a TSV structure. However, the embodiments are not limited to this example, but the present invention can be applied to a case of filling a recess of an object to be processed of an ordinary semiconductor substrate about 0.7 mm in thickness that has the recess in its upper surface as a via hole or a through-hole. In this case, the recess to be filled is formed in, for example, an interlayer insulator.

Moreover, in the embodiments, although a description is given by taking examples of a so-called batch type film deposition apparatus that can process a plurality of objects to be processed at one time, the present invention is not limited to the examples, and can be undoubtedly applied to a single substrate processing type film deposition apparatus that process a substrate at each time.

Furthermore, in the present invention, a substrate constituting an object to be processed includes a compound semiconductor substrate such as GaAs, SiC, GaN and the like in addition to a silicon substrate, and is not limited to these substrates. Moreover, the present invention can be applied to a glass substrate used in a liquid crystal display, a ceramic substrate and the like.

The present application is based on and claims the benefit of priority of Japanese Patent Application No. 2012-102609 filed on Apr. 27, 2012, Japanese Patent Application No. 2013-20057 filed on Feb. 5, 2013, and Japanese Patent Application No. 2013-27972 filed on Feb. 15, 2013, the entire contents of which are herein incorporated by reference.

DESCRIPTION OF THE REFERENCE NUMERALS 2 object to be processed
4 substrate 6 conductive layer
20 film deposition apparatus
26 process chamber
34 wafer boat (holding unit)
64 evacuation system
74 gas supply unit
76 first source gas supply system
78 second source gas supply system
82 first raw material
102 second raw material
128 apparatus control unit
140 insulating film
142 barrier film
S1 first process
S2 second process

The invention claimed is:

1. A method for depositing a film, comprising steps of:
accommodating an object to be processed in a process chamber;
depositing an insulating film made of a polymer thin film on a surface of the object to be processed by supplying a first source gas composed of an acid anhydride and a second source gas composed of a diamine into the process chamber that is evacuated; and
modifying the insulating film so as to cause the insulating film to have a barrier function by stopping the supply of the second source gas into the process chamber and continuously supplying the first source gas into the process chamber.

2. The method as claimed in claim 1, wherein a process temperature in the process chamber is in a range of 20 to 450 degrees C.

3. The method as claimed in claim 1, wherein a process pressure in the process chamber is in a range of 0.1 to 1.0 Torr.

4. The method as claimed in claim 3,
wherein the acid anhydride includes at least one material selected from a group consisting of pyromellitic anhydride, oxydiphthalic anhydride, biphthalicanhydride, carbonyldiphthalic anhydride, diphthalic anhydride, sulfonyldiphthalic anhydride, cyclohexanetetracarboxylic dianhydride, cyclopentanetetracarboxylic dianhydride, and cyclobutanetetracarboxylic dianhydride, and
the diamine includes at least one material selected from a group consisting of oxydianiline, decanediamine, ethylenediamine, diaminoundecan, trimethylenediamine, diaminododecane, diaminobutane, hexafluoropropane, diaminopentane, thiodianiline, aminophenyl sulfide, diaminohexane, diaminophenylphenyl sulfone, heptanediamine, diaminobenzophenone, diaminooctane, diaminononane, diaminodicyclohexylmethane, and methylcyclohexanamine.

5. The method as claimed in claim 1, further comprising a step of:
forming a barrier film on a surface of the modified insulating film.

* * * * *